(12) United States Patent
Mizomoto

(10) Patent No.: US 12,431,392 B2
(45) Date of Patent: Sep. 30, 2025

(54) SUBSTRATE PROCESSING METHOD AND SUBSTRATE PROCESSING APPARATUS

(71) Applicant: Tokyo Electron Limited, Tokyo (JP)

(72) Inventor: Yasutaka Mizomoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 475 days.

(21) Appl. No.: 17/631,900

(22) PCT Filed: Jul. 20, 2020

(86) PCT No.: PCT/JP2020/028011
§ 371 (c)(1),
(2) Date: Feb. 1, 2022

(87) PCT Pub. No.: WO2021/024770
PCT Pub. Date: Feb. 11, 2021

(65) Prior Publication Data
US 2022/0270926 A1    Aug. 25, 2022

(30) Foreign Application Priority Data

Aug. 2, 2019 (JP) ................. 2019-143300

(51) Int. Cl.
*H01L 21/78* (2006.01)
*H01L 21/02* (2006.01)
(Continued)

(52) U.S. Cl.
CPC .... *H01L 21/7806* (2013.01); *H01L 21/02334* (2013.01); *H01L 21/67092* (2013.01); *H01L 21/30* (2013.01)

(58) Field of Classification Search
CPC ........... H01L 21/7806; H01L 21/67092; H01L 2221/68327; H01L 2221/68381;
(Continued)

(56) References Cited

U.S. PATENT DOCUMENTS

2007/0273018 A1* 11/2007 Onozuka ................. H01L 24/96
                                                257/E21.705
2015/0048523 A1*  2/2015 Suga .................. B23K 37/0408
                                                228/104
(Continued)

FOREIGN PATENT DOCUMENTS

CN    105161437 A    12/2015
JP    H10-125929 A    5/1998
(Continued)

OTHER PUBLICATIONS

International Search Report of PCT/JP2020/028011 dated Oct. 27, 2020.

*Primary Examiner* — Eva Y Montalvo
*Assistant Examiner* — Nicholas B Michaud
(74) *Attorney, Agent, or Firm* — Shih IP Law Group, PLLC

(57) ABSTRACT

A substrate processing method includes preparing a stacked substrate including a first substrate divided into multiple chips, a protective film divided for each of the multiple chips to protect the chip, a second substrate supporting the first substrate, and an adhesive film configured to attach the protective film and the second substrate; reducing adhesive strength of the adhesive film with a light beam configured to penetrate the second substrate; and picking-up, from the adhesive film by a pick-up device, the chip and the protective film with the reduced adhesive strength to the adhesive film.

9 Claims, 14 Drawing Sheets

(51) Int. Cl.
*H01L 21/30* (2006.01)
*H01L 21/67* (2006.01)

(58) Field of Classification Search
CPC ................ H01L 21/6835; H01L 21/78; H01L 21/67115; H01L 21/304; H01L 21/6836; H01L 21/02334; B23K 26/364
USPC ........................................................ 438/463
See application file for complete search history.

(56) References Cited

U.S. PATENT DOCUMENTS

| | | | |
|---|---|---|---|
| 2015/0179521 A1* | 6/2015 | Mizomoto | H01L 21/67092 438/464 |
| 2017/0301564 A1 | 10/2017 | Guo | |
| 2019/0378759 A1* | 12/2019 | Sugiya | H01L 21/67288 |
| 2020/0051861 A1* | 2/2020 | Piao | H01L 21/78 |
| 2020/0091001 A1* | 3/2020 | Lei | H01L 21/82 |
| 2020/0406308 A1* | 12/2020 | Itou | B08B 3/041 |

FOREIGN PATENT DOCUMENTS

| | | |
|---|---|---|
| JP | 2004-207607 A | 7/2004 |
| JP | 2007-260866 A | 10/2007 |
| JP | 2017-174996 A | 9/2017 |
| JP | 2018-018980 A | 2/2018 |

\* cited by examiner

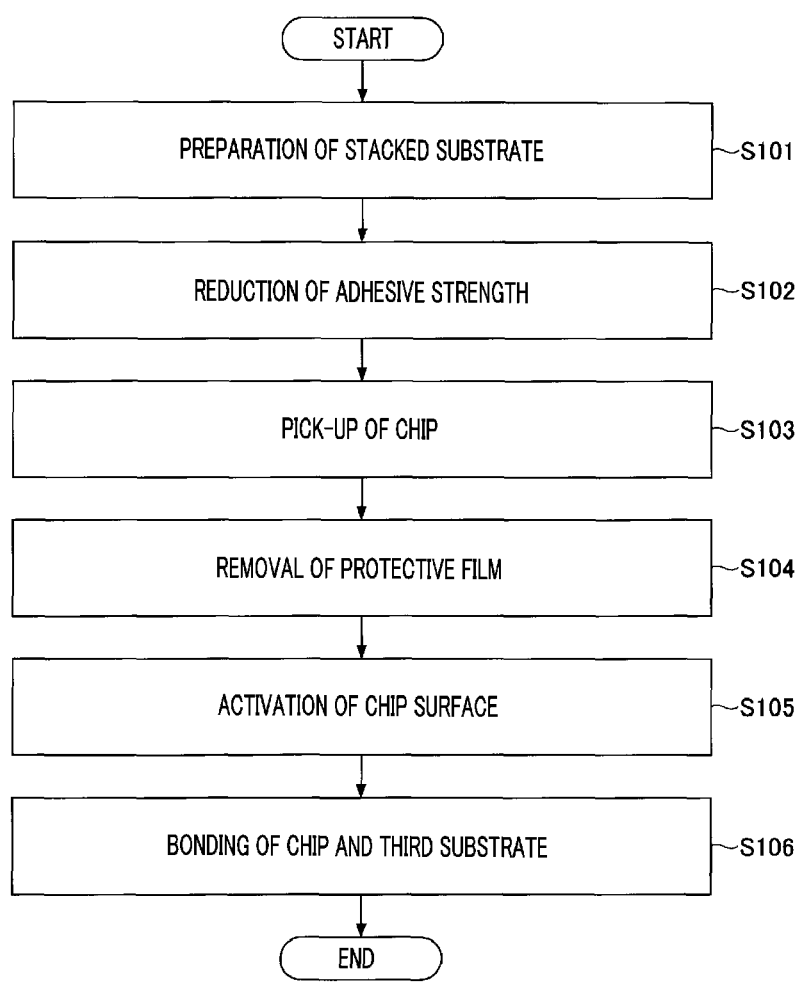

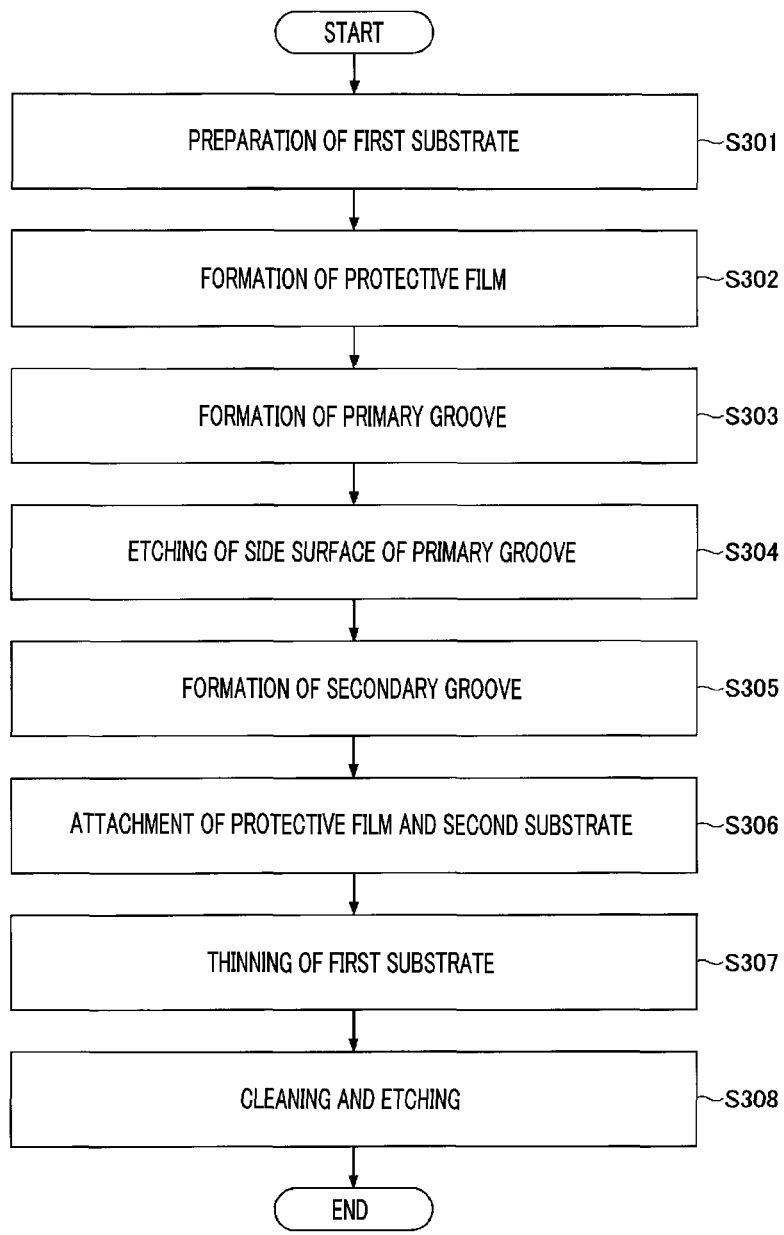

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2020/028011 filed on Jul. 20, 2020, which claims the benefit of Japanese Patent Application No. 2019-143300 filed on Aug. 2, 2019, the entire disclosures of which are incorporated herein by reference.

TECHNICAL FIELD

The various aspects and embodiments described herein pertain generally to a substrate processing method and a substrate processing apparatus.

BACKGROUND

A division method for a semiconductor wafer described in Patent Document 1 includes a bonding process, a polishing process, a dividing process, and a pick-up process. In the bonding process, the semiconductor wafer and a support substrate for supporting the semiconductor wafer are bonded as one body with an adhesive therebetween in the state that a front surface of the semiconductor wafer are in contact with a top surface of the support substrate. In the polishing process, a rear surface of the semiconductor wafer bonded as one body with the support substrate is polished. In the dividing process, the semiconductor wafer bonded as one body with the support substrate is divided into individual semiconductor chips from the rear surface side thereof. In the pick-up process, the semiconductor chips are picked up from the support substrate. Before the pick-up, an external stimulus such as an ultraviolet ray is applied to the adhesive to reduce adhesive strength thereof.

PRIOR ART DOCUMENT

Patent Document 1: Japanese Patent Laid-open Publication No. 2004-207607

DISCLOSURE OF THE INVENTION

Means for Solving the Problems

In one exemplary embodiment, a substrate processing method includes preparing a stacked substrate including a first substrate divided into multiple chips, a protective film divided for each of the multiple chips to protect the chip, a second substrate supporting the first substrate, and an adhesive film configured to attach the protective film and the second substrate; reducing adhesive strength of the adhesive film with a light beam configured to penetrate the second substrate; and picking-up, from the adhesive film by a pick-up device, the chip and the protective film with the reduced adhesive strength to the adhesive film.

BRIEF DESCRIPTION OF THE DRAWINGS

FIG. 1 is a flowchart illustrating a substrate processing method according to an exemplary embodiment.

FIG. 9 is a flowchart illustrating a second example of the processing performed before the process S101 of FIG. 1.

DETAILED DESCRIPTION

Figure 2A:
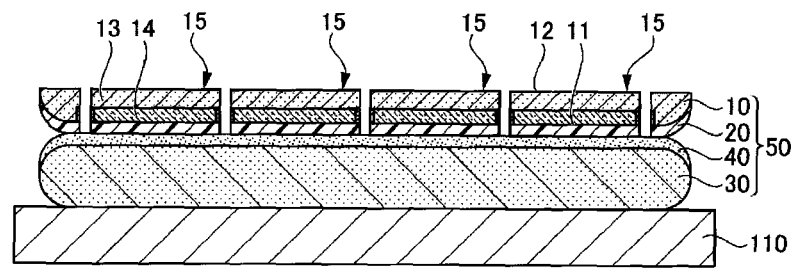
FIG. 2A, FIG. 2B, and FIG. 2C are diagrams illustrating a process S101, a process S102, and a process S103 of FIG. 1, respectively.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction and the Z-axis direction are orthogonal to each other. The X-axis and Y-axis directions are horizontal directions, and the Z-axis direction is a vertical direction.

As shown in FIG. 1, the substrate processing method includes preparation of a stacked substrate (S101), reduction of adhesive strength (S102), pick-up of a chip (S103), removal of a protective film (S104), activation of a chip surface (S105), and bonding of the chip and a third substrate (S106). Further, the substrate processing method may further include other processings than the processings shown in FIG. 1. A processing performed before the preparation of the stacked substrate (S101) will be described later.

In the preparation of the stacked substrate (S101), a stacked substrate 50 including a first substrate 10, a protective film 20, a second substrate 30, and an adhesive film 40 is prepared, as shown in FIG. 2A. The preparation of the stacked substrate 50 includes, for example, holding the stacked substrate 50 on a first holding table 110. The first holding table 110 holds the stacked substrate 50 from below while allowing a second main surface 12 of the first substrate 10 to face upwards. The first substrate 10 has a first main surface 11 and the second main surface 12 opposite to the first main surface 11.

Figure 2B:
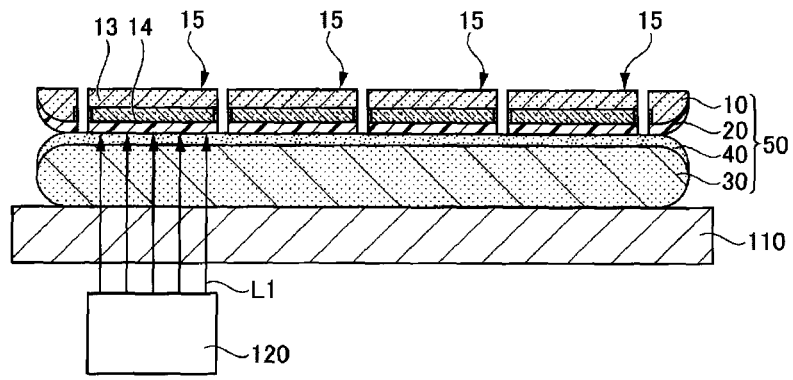
Figure 2C:
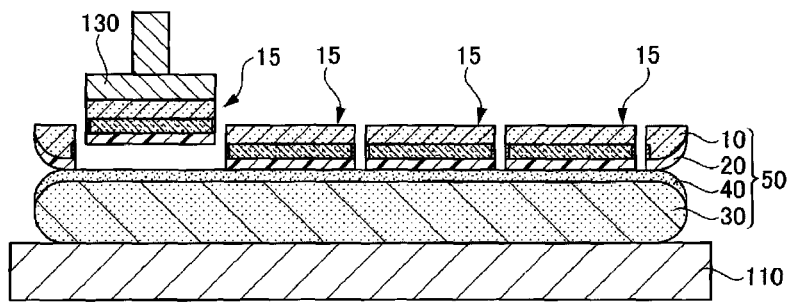

The first substrate 10 includes an underlying substrate 13 and devices 14 formed on a surface of the underlying substrate 13. The underlying substrate 13 is a glass substrate or a semiconductor substrate such as a silicon wafer. In the process S101, the first substrate 10 is already divided into a plurality of chips 15. Each of the plurality of chips 15 includes the device 14. Here, the number of the chips 15 is not particularly limited. FIG. 2A to FIG. 2C illustrate a smaller number of chips 15 than those shown in FIG. 4 for space reasons.

Figure 4:
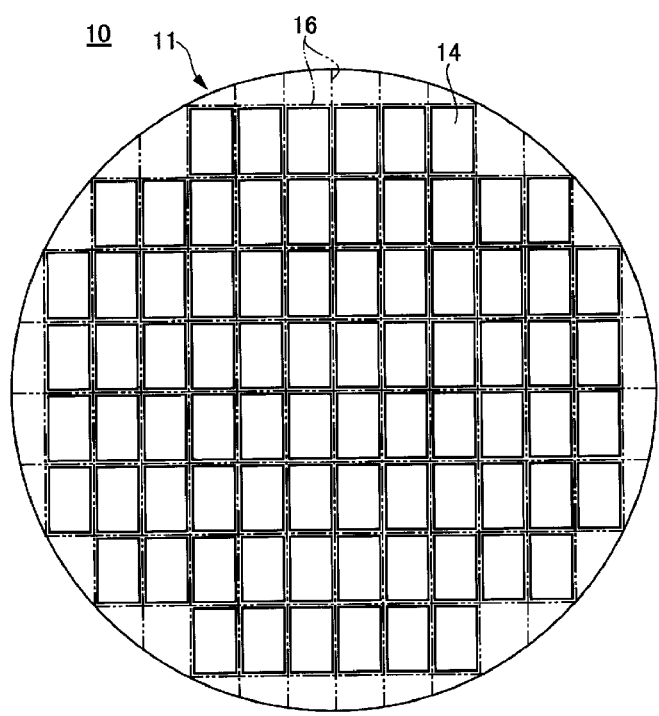
FIG. 4 is a plan view illustrating an example of a first main surface of a first substrate before being divided.

As shown in FIG. 4, the first main surface 11 of the first substrate 10 before being divided is partitioned into multiple regions by multiple division lines 16 which intersect with each other. In each of the multiple regions, the device 14 such as a semiconductor element, a circuit, or a terminal is formed in advance. The first substrate 10 is divided into the plurality of chips 15 by being split along the multiple division lines 16.

As depicted in FIG. 2A to FIG. 2C, the protective film 20 protects the first main surface 11 of the first substrate 10 and the devices 14 on the first main surface 11. The protective film 20 is formed of, for example, a resin. In the process S101, the protective film 20 is already divided at the same positions where the first substrate 10 is divided. That is, the protective film 20 is already divided for each of the chips 15. A division surface of the protective film 20 and a division surface of the chip 15 may lie on the same plane.

The second substrate 30 supports the first substrate 10. The second substrate 30 supports the plurality of chips 15 to be flat, thus suppressing the chips 15 from being bent. The thickness of the second substrate 30 may be larger than the thickness of the chip 15. The second substrate 30 may have a diameter larger than that of the first substrate 10. The second substrate 30 may be, by way of non-limiting example, a semiconductor substrate or a glass substrate.

The adhesive film 40 serves to bond the protective film 20 and the second substrate 30 together. The adhesive film 40 is formed of, for example, a resin. The adhesive film 40 is not particularly limited as long as adhesive strength thereof is reduced by a light beam such as an infrared ray configured to penetrate the second substrate 30. By way of example, the adhesive film 40 may include a microcapsule that expands or foams when the light beam is radiated thereto, or a foaming agent that foams when the light beam is radiated thereto. In addition, the adhesive film 40 may be of a type that is sublimated by the radiation of the light beam.

In the reduction of the adhesive strength (S102), the adhesive strength of the adhesive film 40 is reduced by a light beam L1 that penetrates the second substrate 30, as illustrated in FIG. 2B. The light beam L1 is radiated from the second substrate 30 to the adhesive film 40. As compared to a case where the light beam L1 is radiated from the first substrate 10 to the adhesive film 40, the intensity of the light beam L1 reaching the device 14 of the first substrate 10 is low, so that deterioration of the device 14 can be suppressed. The reduction of the adhesive strength may be performed for the entire adhesive film 40 at once, or may be performed for each of the chips 15 individually.

The first holding table 110 is configured to be movable in the X-axis direction and the Y-axis direction in order to change a radiation position of the light beam L1 with respect to the adhesive film 40. Any configuration may be adopted as long as the radiation position of the light beam L1 with respect to the adhesive film 40 can be changed. For example, a radiating device 120 configured to radiate the light beam L1 may be moved. Further, if the radiating device 120 includes a galvano scanner or the like, neither the first holding table 110 nor the radiating device 120 needs to be moved.

The intensity of the light beam L1 is reduced when it comes into contact with the adhesive film 40. This is because most energy of the light beam L1 is used to reduce the adhesive strength of the adhesive film 40. However, a part of the light beam L1 may pass through the adhesive film 40 without being absorbed by the adhesive film 40.

Therefore, in the present exemplary embodiment, the protective film 20 is provided between the adhesive film 40 and the first substrate 10, as shown in FIG. 2B. When the light beam L1 passes through the protective film 20, a part of the light beam L1 is absorbed by the protective film 20, and the intensity of the light beam L1 is further reduced. As a result, the intensity of the light beam L1 reaching the device 14 of the first substrate 10 can be further reduced, so that deterioration of the device 14 can be further suppressed. A material of the protective film 20 may be appropriately selected based on the wavelength of the light beam L1.

When the second substrate 30 is a silicon wafer, an infrared ray, for example, is used as the light beam L1 that penetrates the silicon wafer, and the wavelength of the light beam L1 is in the range of, e.g., 700 nm to 1 mm. The light beam L1 may be a laser beam. Oscillation of the laser beam may be either a continuous oscillation type or a pulse oscillation type. A semiconductor laser, a YAG laser, or a carbon dioxide laser may be used as a light source of the laser beam.

In case that the light beam L1 also penetrates the first holding table 110, the first holding table 110 may be made of glass. Further, the first holding table 110 may be configured such that the light beam L1 does not reach it. For example, the first holding table 110 may be configured to hold only an outer periphery of the stacked substrate 50. In this case, the first holding table 110 may be made of a metal or ceramic without being limited to the glass.

In the pick-up of the chip 15 (S103), the protective film 20 with the reduced adhesive strength to the adhesive film 40 and the chip 15 are picked up from the adhesive film 40 by a pick-up device 130, as shown in FIG. 2C. The pick-up device 130 is configured to attract the chip 15 from above. The size of an attraction surface of the pick-up device 130 is equal to or slightly larger than the size of a top surface of the chip 15. The pick-up device 130 is, for example, a collet.

The chip 15 is supported by the hard second substrate 30 until it is picked up by the pick-up device 130. As compared to a case where the chip 15 is supported by a soft tape such as a so-called dicing tape instead of the second substrate 30, there is little change in the position of the chip 15. Thus, alignment between the chip 15 and the pick-up device 130 can be easily carried out.

Figure 3A:
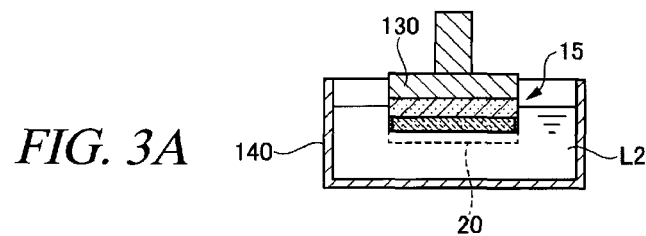
FIG. 3A, FIG. 3B, and FIG. 3C are diagrams illustrating a process S104, a process S105, and a process S106 of FIG. 1, respectively.

In the removal of the protective film 20 (S104), in the state that the chip 15 is held by the pick-up device 130, the protective film 20 is immersed in a liquid L2 configured to dissolve the protective film 20, so that the protective film 20 is removed, as illustrated in FIG. 3A. Since the protective film 20 is removed by being dissolved, particles adhering to the protective film 20 can also be removed.

The liquid L2 is appropriately selected based on the material of the protective film 20. By way of example, the liquid L2 may be an organic solvent. The liquid L2 is stored in a tub of a storage 140 in advance. The storage 140 is, for example, a container having an open top. When the protective film 20 is immersed in the liquid L2, the pick-up device 130 does not need to be immersed in the liquid L2. Thus, degradation of the pick-up device 130 can be suppressed.

After the chip 15 is picked up (S103), the pick-up device 130 continues to hold the chip 15 from above while allowing the protective film 20 to face downwards, at least until the removal of the protective film 20 (S104). When the protective film 20 is immersed in the liquid L2, the pick-up device 130 does not need to be immersed in the liquid L2. Further, since the chip 15 is not transferred between the pick-up device 130 and another pick-up device, it is possible to suppress the chip 15 from being broken during the transfer.

Figure 3B:
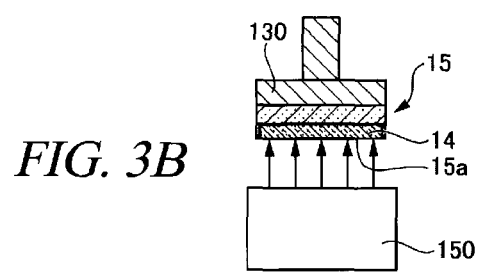

In the activation of the chip surface (S105), a surface 15a of the chip 15 from which the protective film 20 has been removed is activated in the state that the chip 15 is held by the pick-up device 130, as illustrated in FIG. 3B. The surface 15a of the chip 15 is the first main surface 11 of the first substrate 10, and the device 14 is provided on the surface 15a of the chip 15. Since the surface of the device 14 is activated, it can be bonded to a main surface 61 of a third substrate 60 to be described later on which a device 64 is formed.

An activating device 150 is configured to activate the surface 15a of the chip 15. The activating device 150 is, for example, a plasma forming device, and activates the surface 15a of the chip 15 by formed plasma. The plasma may be atmospheric pressure plasma or vacuum plasma. As a specific example, it may be atmospheric pressure plasma which does not require a vacuum container.

The plasma is formed by exciting, for example, an oxygen gas or a nitrogen gas. The plasma forms functional groups or dangling bonds by cutting, for example, chemical bonds of a molecule (e.g., $SiO_2$) in the surface 15a. The activating device 150 may process the surface 15a of the chip 15 with pure water after processing it with the plasma, thus hydrophilizing the surface 15a of the chip 15.

After the chip 15 is picked up (S103), the pick-up device 130 continues to hold the chip 15 from above while allowing the protective film 20 to face downwards, at least until the activation of the chip surface (S105). Since the chip 15 is not transferred between the pick-up device 130 and another pick-up device, it is possible to suppress the chip 15 from being broken during the transfer.

Figure 3C:
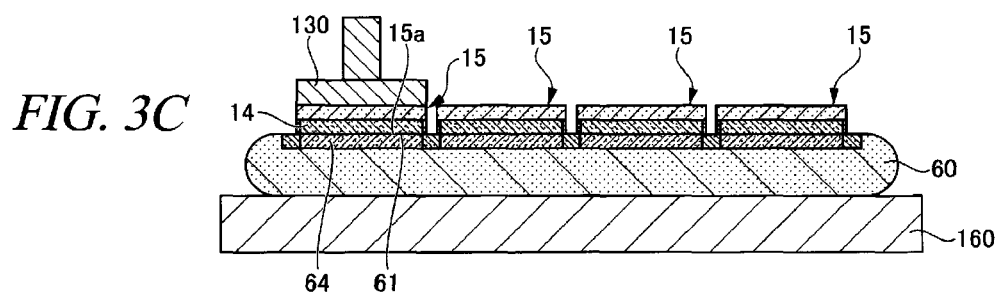

In the bonding of the chip 15 and the third substrate 60 (S106), in the state that the chip 15 is held by the pick-up device 130, the activated surface 15a of the chip 15 is bonded to the main surface 61 of the third substrate 60 on which the device 64 is formed, as shown in FIG. 3C. The device 14 on the surface 15a of the chip 15 and the device 64 on the main surface 61 of the third substrate 60 are bonded, so that the third substrate 60 to which the chip 15 is attached is obtained. The third substrate 60 having the chip 15 attached thereto may be a so-called COW (Chip On Wafer).

The second holding table 160 holds the third substrate 60 from below, allowing the main surface 61 of the third substrate 60 to face upwards. Meanwhile, the pick-up device 130 holds the chip 15 from above, allowing the activated surface 15a of the chip 15 to face downwards. After the chip 15 is picked up (S103), the pick-up device 130 keeps on holding the chip 15 from above while allowing the surface 15a of the chip 15 faces downwards, until the chip 15 and the third substrate 60 are bonded (S106). Since the chip 15 is not transferred between the pick-up device 130 and another pick-up device, it is possible to suppress the chip 15 from being broken during the transfer.

Figure 5:
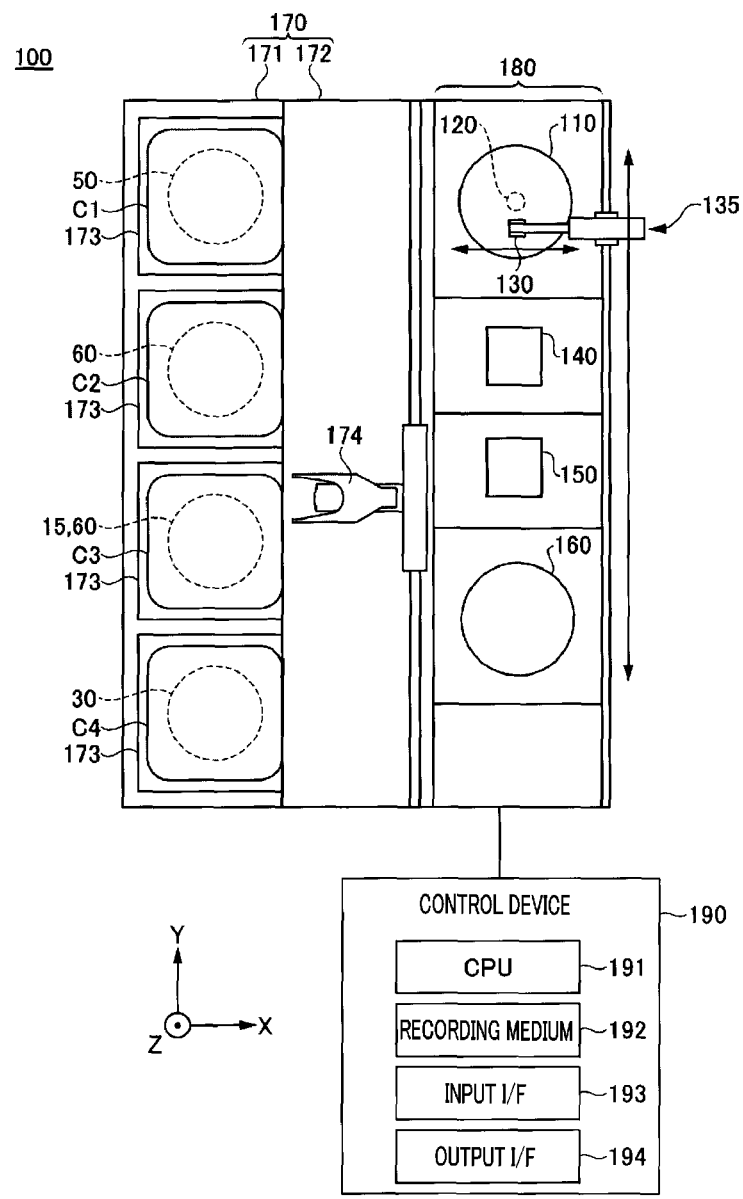
FIG. 5 is a plan view illustrating a substrate processing apparatus according to the exemplary embodiment.

The preparation of the stacked substrate (S101), the reduction of the adhesive strength (S102), the pick-up of the chip (S103), the removal of the protective film (S104), the activation of the chip surface (S105), and the bonding of the chip and the third substrate (S106) shown in FIG. 1 are performed in a substrate processing apparatus 100 shown in FIG. 5, for example.

As illustrated in FIG. 5, the substrate processing apparatus 100 is equipped with a carry-in/out station 170, a processing station 180, and a control device 190. The carry-in/out station 170 and the processing station 180 are arranged in this order from the negative X-axis side toward the positive X-axis side.

The carry-in/out station 170 has a carry-in/out block 171 and a transfer block 172. The transfer block 172 is disposed next to the carry-in/out block 171, for example, on the positive X-axis side of the carry-in/out block 171. Further, the transfer block 172 is disposed next to the processing station 180, for example, on the negative X-axis side of the processing station 180.

The carry-in/out block 171 includes a plurality of placing units 173 arranged in a row in the Y-axis direction. A cassette is placed in each of the plurality of placing units 173. A first cassette C1 accommodates therein the stacked substrate 50, a second cassette C2 accommodates therein the third substrate 60, a third cassette C3 accommodates therein the third substrate 60 to which the chip 15 is attached, and a fourth cassette C4 accommodates therein the second substrate 30 remaining after the chip 15 and the protective film 20 are picked up from the stacked substrate 50. Here, the number of the placing units 173 is not particularly limited. Likewise, the number of the cassettes is not particularly limited, either.

A transfer device 174 is provided inside the transfer block 172. The transfer device 174 has a holder configured to hold the stacked substrate 50, the third substrate 60, and the like. The holder is configured to be movable in horizontal directions (both in the X-axis direction and the Y-axis direction) and a vertical direction and pivotable around a vertical axis. The transfer device 174 takes out the stacked substrate 50 from the first cassette C1 and places it on the first holding table 110. Further, the transfer device 174 takes out the third substrate 60 from the second cassette C2, and places it on the second holding table 160. Furthermore, the transfer device 174 receives the third substrate 60 having the chip 15 attached thereto from the second holding table 160, and stores it in the third cassette C3. In addition, the transfer device 174 receives from the first holding table 110 the second substrate 30 remaining after the chip 15 and the protective film 20 are picked up from the stacked substrate 50, and stores the received second substrate 30 in the fourth cassette C4.

The processing station 180 includes the first holding table 110, the radiating device 120, the pick-up device 130, the moving device 135, the storage 140, the activating device 150, and the second holding table 160. The first holding table 110, the storage 140, the activating device 150, and the second holding table 160 are arranged in this order from the positive Y-axis side toward the negative Y-axis side. The radiating device 120 is provided under the first holding table 110. The pick-up device 130 is configured to be movable in the horizontal directions (both in the X-axis direction and the Y-axis direction) and the vertical direction and pivotable around a vertical axis. Although one pick-up device 130 is provided in FIG. 5, a plurality of pick-up devices 130 may be provided. The moving device 135 moves the pick-up device 130 so that the chip 15 held by the pick-up device 130 is moved from the first holding table 110 onto the second holding table 160 via the storage 140 and the activating device 150.

The control device 190 is, for example, a computer, and includes a CPU (Central Processing Unit) 191 and a recording medium 192 such as a memory, as shown in FIG. 5. The recording medium 192 stores therein a program for controlling various processings performed in the substrate processing apparatus 100. The control device 190 controls an operation of the substrate processing apparatus 100 by allowing the CPU 191 to execute the program stored in the recording medium 192. Furthermore, the control device 190 includes an input interface 193 and an output interface 194. The control device 190 receives a signal from the outside through the input interface 193 and transmits a signal to the outside through the output interface 194.

The program is stored in, for example, a computer-readable recording medium, and is installed from this recording medium to the recording medium 192 of the control device 190. The computer-readable recording medium may be, by way of non-limiting example, a hard disk (HD), a flexible disk (FD), a compact disk (CD), a magnet optical disk (MO), a memory card, or the like. In addition, the program may be downloaded from a server via the Internet and installed in the recording medium 192 of the control device 190.

Now, a first example of the processing performed before the process S101 of FIG. 1 will be explained with reference to FIG. 6, FIG. 7A to FIG. 7D, and FIG. 8A to FIG. 8C.

Figure 6:
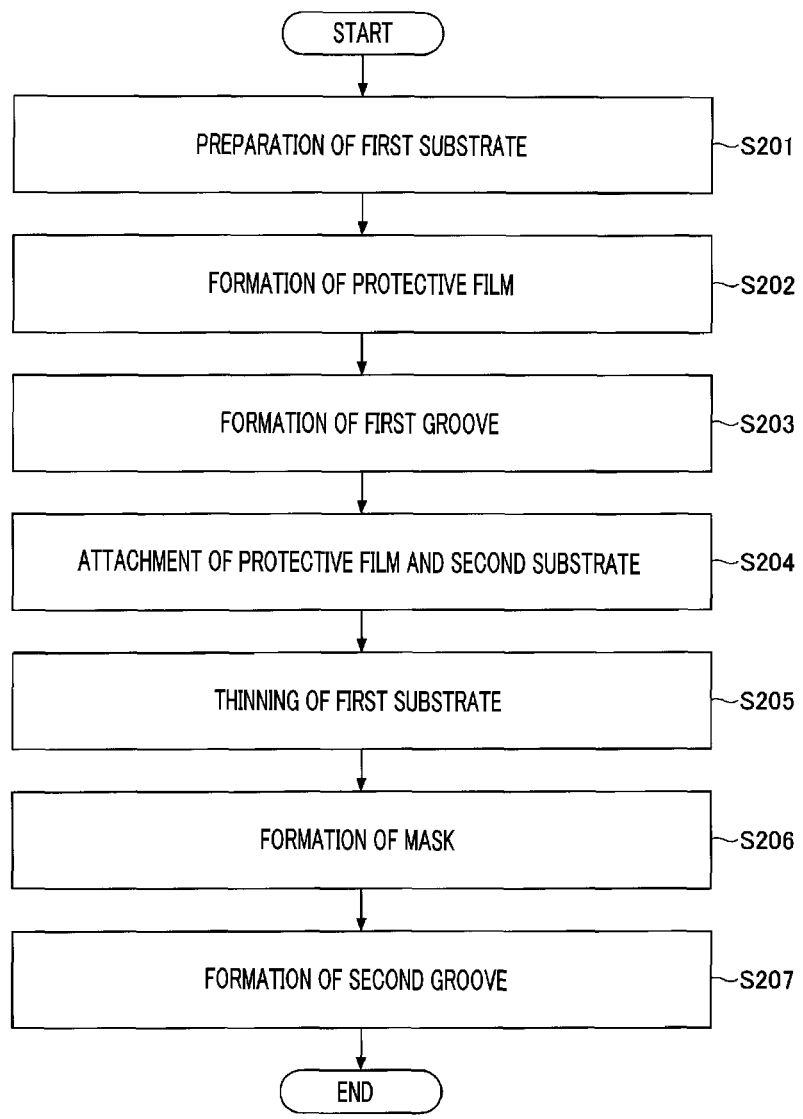
FIG. 6 is a flowchart illustrating a first example of a processing performed before the process S101 of FIG. 1.

As depicted in FIG. 6, the substrate processing method includes preparation of the first substrate 10 (S201), formation of the protective film 20 (S202), formation of first grooves 71 (S203), attachment of the protective film 20 and the second substrate 30 (S204), thinning of the first substrate 10 (S205), formation of a mask 72 (S206), and formation of second grooves 73 (S207).

Figure 7A:
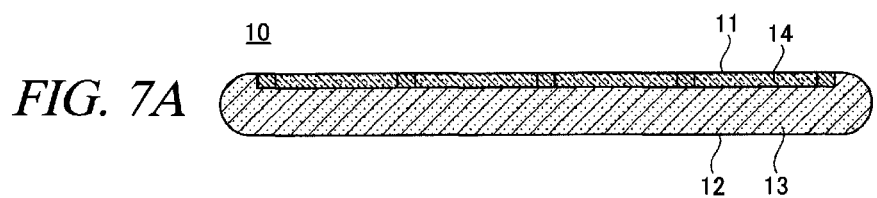
FIG. 7A, FIG. 7B, FIG. 7C, and FIG. 7D are diagrams illustrating a process S201, a process S202, a process S203, and a process S204 of FIG. 6, respectively.

In the preparation of the first substrate 10 (S201), the first substrate 10 is held on a non-illustrated holding table, for example. The first substrate 10 is held from below with the first main surface 11 thereof facing upwards, as shown in FIG. 7A. The devices 14 are already formed on the first main surface 11.

Figure 7B:
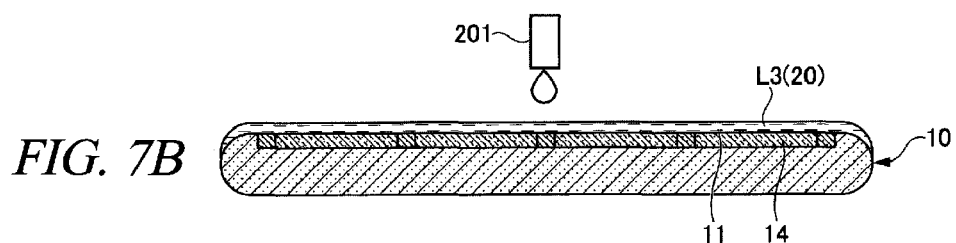

In the formation of the protective film 20 (S202), the protective film 20 is formed on the first main surface 11 of the first substrate 10, as illustrated in FIG. 7B. The protective film 20 is formed by, for example, a spin coating method. A nozzle 201 discharges a coating liquid L3 onto the first substrate 10 being rotated from above it to form a liquid film of the coating liquid L3. If the liquid film is dried, the protective film 20 is obtained. Further, the method of coating the coating liquid L3 is not limited to the spin coating method.

As stated above, the protective film 20 absorbs the light beam L1 having passed through the adhesive film 40 in the reduction of the adhesive strength (S102), thus suppressing the deterioration of the devices 14. Further, the protective film 20 also serves to suppress debris generated during the formation of the first grooves 71 (S203) to be described later from adhering to the devices 14.

Figure 7C:
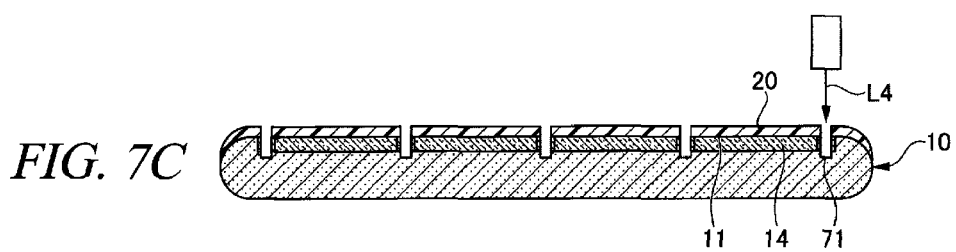

In the formation of the first grooves 71 (S203), each first groove 71, which is deeper than the device 14, is formed on a division line of the surface of the protective film 20, as illustrated in FIG. 7C. The first groove 71 reaches the underlying substrate 13. The division line of the surface of the protective film 20 coincides with the division line 16 of the first main surface 11 of the first substrate 10 when viewed from the top. For example, the position of the division line 16 is detected by acquiring an image of the first main surface 11 with an infrared camera or the like and performing an image processing on the acquired image. A formation position where the first groove 71 is to be formed is determined to be the position of the detected division line 16.

Although it is possible to form the first groove 71 by a cutting processing with a blade, the first groove 71 is formed by an ablation processing with a laser beam L4 in the present exemplary embodiment. The ablation processing is effective when the device 14 is soft, for example, when the device 14 contains a porous Low-k material or the like. In order to suppress overheating of the device 14, a short-pulse laser may be used as a light source of the laser beam L4.

The wavelength of the laser beam L4 may be different from the wavelength of the light beam L1. It is because the laser beam L4 and the light beam L1 have different functions. The light beam L1 is used to reduce the adhesive strength of the adhesive film 40 as described above. The wavelength of the laser beam L4 may be shorter than the wavelength of the light beam L1, for example, equal to or less than 600 nm.

The formation of the first grooves 71 (S203) is performed after the formation of the protective film 20 (S202) and before the attachment of the protective film 20 and the second substrate 30 (S204). Since the protective film 20 is formed before the first grooves 71 are formed, adhesion of the debris generated during the formation of the first grooves 71 to the device 14 can be suppressed.

Figure 7D:
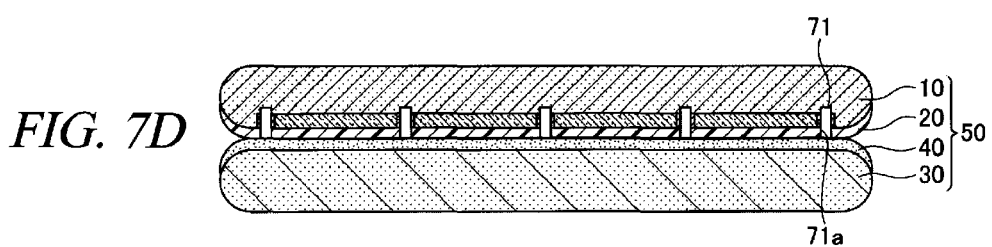

In the attachment of the protective film 20 and the second substrate 30 (S204), the protective film 20 and the second substrate 30 are attached by the adhesive film 40, as shown in FIG. 7D. Since the first substrate 10 and the second substrate 30 are attached to each other with the adhesive film 40 therebetween, the second substrate 30 is able to support the first substrate 10.

The adhesive film 40 is formed by coating an adhesive on a bonding surface of the second substrate 30, and the protective film 20 is then provided thereon. Accordingly, the first grooves 71 on the surface of the protective film 20 can be suppressed from being filled with the adhesive. In addition, the adhesive film 40 may be supplied in the form of a sheet. In such a case, the adhesive film 40 may be first attached to either the protective film 20 or the second substrate 30.

The thinning of the first substrate 10 (S205) is performed after the attachment of the protective film 20 and the second substrate 30 (S204). The thinning of the first substrate 10 includes grinding of the second main surface 12 of the first substrate 10, as shown to FIG. 8A. After the grinding, polishing may be further performed. Since the first substrate 10 is processed in the state that the first substrate 10 is reinforced with the second substrate 30, cracking of the first substrate 10 or the like can be suppressed. The grinding of the first substrate 10 is performed by a whetstone 202. The whetstone 202 is lowered while being rotated and grinds the top surface (second main surface 12) of the first substrate 10 being rotated. The polishing is performed in the same manner. The first grooves 71 are not exposed on the thinned second main surface 12.

Figure 8A:
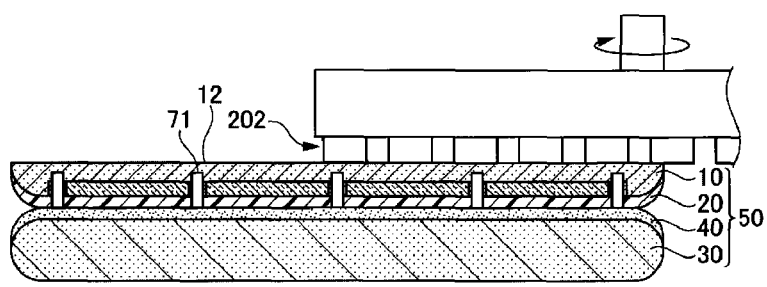
FIG. 8A, FIG. 8B, and FIG. 8C are diagrams illustrating a process S205, a process S206, and a process S207 of FIG. 6, respectively.
Figure 8B:
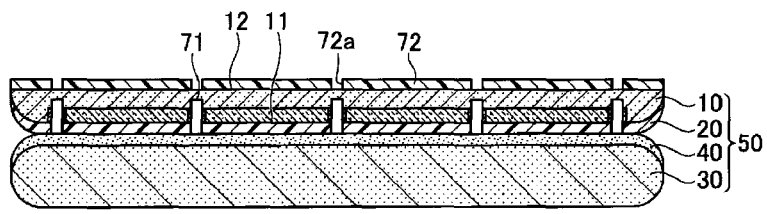

The formation of the mask 72 (S206) is performed after the thinning of the first substrate 10 (S205). The mask 72 is formed by a photolithography method or the like, and the mask 72 has openings 72a on the division lines of the second main surface 12 of the first substrate 10, as illustrated in FIG. 8B. The division lines of the second main surface 12 and the division lines 16 of the first main surface 11 coincide, when viewed from the top. The positions of the division lines 16 are detected by acquiring an image of the first main surface 11 with an infrared camera or the like and performing an image processing on the acquired image. The formation positions of the openings 72a of the mask 72 are determined to be the positions of the detected division lines 16. Here, the material of the mask 72 is not particularly limited as long as it can withstand etching to be described later.

Figure 8C:
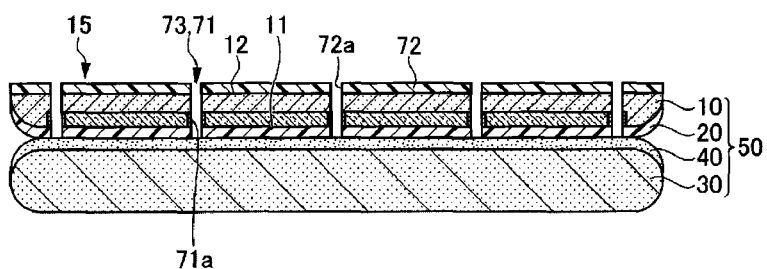

In the formation of the second grooves 73 (S207), the second main surface 12 of the first substrate 10 is etched through the openings 72a of the mask 72, and, as a result, the second grooves 73 connected to the first grooves 71 are formed to divide the first substrate 10 into the plurality of chips 15, as shown in FIG. 8C. The plurality of chips 15 are supported flat by the second substrate 30. The etching may be either wet etching or dry etching. For example, dry etching having good anisotropy may be used. As a further specific example, plasma etching may be adopted.

Since the first substrate 10 is divided into the plurality of chips 15 by the etching, distortions of the chips 15 and formation of scratches on the chips 15 can be suppressed when the chips 15 are divided, and, further, particle generation can also be suppressed during the division of the chips 15. In addition, when the second grooves 73 are connected to the first grooves 71, side surfaces 71a of the first grooves 71 are also etched, so that distortions, scratches and particles generated during the formation of the first grooves 71 can also be removed.

The timing when the mask 72 is removed may be any time after the formation of the second grooves 73 (S207). For example, it may be before the pick-up of the chips 15 (S103), or after the bonding of the chips 15 and the third substrate 60 (S106). In the latter case, the pick-up device 130 holds the chip 15 from above with the mask 72 therebetween.

Next, referring to FIG. 9 and FIG. 10A to FIG. 10D, a second example of the processing performed before the process S101 of FIG. 1 will be explained.

As shown in FIG. 9, the substrate processing method includes preparation of the first substrate 10 (S301), formation of the protective film 20 (S302), formation of primary grooves (S303), side etching of the primary grooves (S304), formation of secondary grooves 75 (S305), attachment of the protective film 20 and the second substrate 30 (S306), thinning of the first substrate 10 (S307), and cleaning and etching (S308).

Since the preparation of the first substrate 10 (S301), the formation of the protective film 20 (S302), and the formation of the primary grooves (S303) are performed in the same manner as in the processes S201, S202 and S203 shown in FIG. 6, redundant description thereof will be omitted here. Further, since the primary grooves obtained in the process S303 are the same as the first grooves 71 shown in FIG. 7C, illustration thereof will also be omitted.

In the side etching of the primary grooves (S304), side surfaces of the primary grooves are etched. The etching may be either wet etching or dry etching. For example, dry etching capable of uniformly etching the side surfaces of the primary grooves in a depth direction may be adopted. As a further specific example, plasma etching may be used. Through this side etching, distortions, scratches and particles generated during the formation of the primary grooves are removed.

Figure 10A:
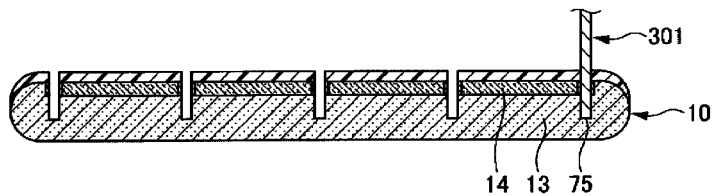
FIG. 10A, FIG. 10B, FIG. 10C, and FIG. 10D are diagrams illustrating a process S305, a process S306, a process S307, and a process S308 of FIG. 9, respectively.

In the formation of the secondary grooves 75 (process S305), by cutting bottom surfaces of the primary grooves with a blade 301, the primary grooves are extended in the depth direction to form the secondary grooves 75, as shown in FIG. 10A. The depth of the secondary grooves 75 is set so that they may reach the second main surface 12 of the first substrate 10 obtained after the thinning (S307) to be described later.

The formation of the secondary grooves 75 (S305) is performed after the formation of the primary grooves (S303), and the primary grooves are formed by an ablation processing with a laser beam. The ablation processing is effective when the device 14 is soft, for example, when the device 14 contains the porous Low-k material, as described above.

The depth of the primary groove is larger than the depth of the device 14, and the primary groove reaches the underlying substrate 13. Since the primary groove is formed in advance, it is possible to suppress the cutting of the device 14 by the blade 301, and, thus, distortion and scratch formation of the device 14 can be suppressed.

Further, depending on the structure of the device 14, the ablation processing with the laser beam may not be performed, and only the cutting processing with the blade 301 may be performed.

Figure 10B:
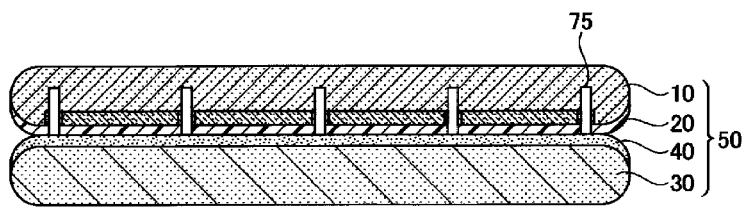

In the attachment of the protective film 20 and the second substrate 30 (S306), the protective film 20 and the second substrate 30 are attached by the adhesive film 40, as shown in FIG. 10B. Since the first substrate 10 and the second substrate 30 are attached to each other with the adhesive film 40 therebetween, the second substrate 30 is able to support the first substrate 10.

Figure 10C:
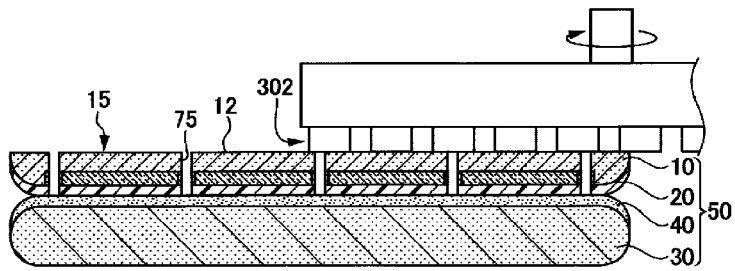

The thinning of the first substrate 10 (S307) is performed after the attachment of the protective film 20 and the second substrate 30 (S306). The thinning of the first substrate 10 includes grinding of the second main surface 12 of the first substrate 10, as shown in FIG. 10C. The grinding is performed by a whetstone 302. After the grinding, polishing may be further performed. By the thinning (S307), the secondary grooves 75 are exposed on the second main surface 12 of the first substrate 10, and the first substrate 10 is divided into the plurality of chips 15. The plurality of chips 15 are supported flat by the second substrate 30.

Figure 10D:
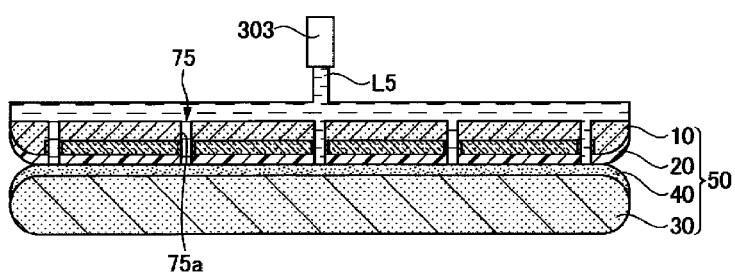

In the cleaning and etching (S308), the secondary grooves 75 are cleaned, and side surfaces 75a of the secondary grooves 75 are etched, as shown in FIG. 10D. Since the secondary grooves 75 are cleaned, grinding debris generated during the thinning of the first substrate 10 and cutting debris generated during the formation of the secondary grooves 75 can be removed. In addition, since the side surfaces 75a of the secondary grooves 75 are etched, distortions and scratches generated during the formation of the secondary grooves 75 can also be removed.

The cleaning of the secondary grooves 75 may be carried out by, for example, scrub cleaning, spin cleaning, or spray cleaning. A nozzle 303 discharges a cleaning liquid L5 onto the stacked substrate 50 from above it. A bottom surface of the stacked substrate 50 as well as a top surface thereof may be cleaned at the same time. In the scrub cleaning, the surface(s) of the stacked substrate 50 may be washed by being rubbed with a brush or sponge (not shown).

The cleaning of the secondary grooves 75 and the etching of the side surfaces 75a of the secondary grooves 75 may be performed individually or all at once. In the latter case, wet etching is performed. In the former case, on the other hand, any of wet etching and dry etching may be performed.

Now, referring to FIG. 11 and FIG. 12, a third example of the processing performed before the process S101 of FIG. 1 will be discussed.

Figure 11:
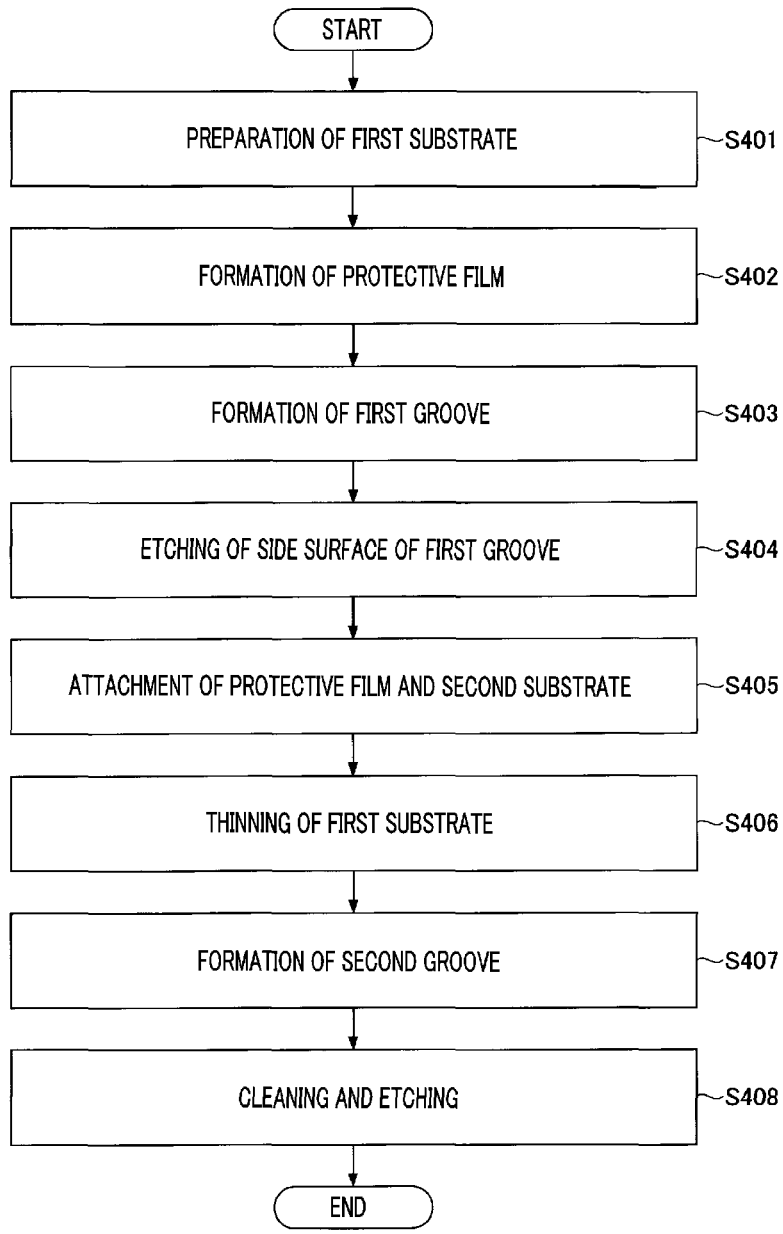
FIG. 11 is a flowchart illustrating a third example of the processing performed before the process S101 of FIG. 1.
Figure 12:
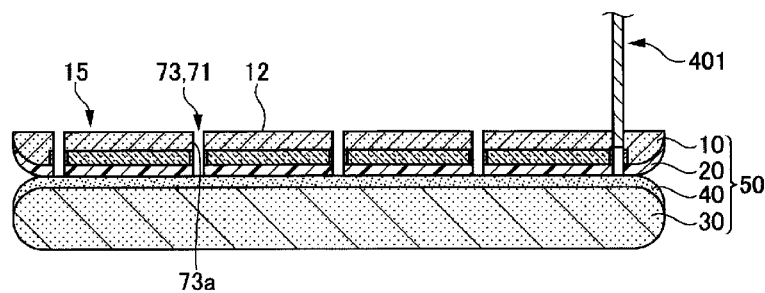
FIG. 12 is a diagram illustrating a process S407 of FIG. 11.

As depicted in FIG. 11, the substrate processing method includes preparation of the first substrate 10 (S401), formation of the protective film 20 (S402), formation of the first grooves 71 (S403), and side etching of the first grooves 71 (S404), attachment of the protective film 20 and the second substrate 30 (S405), thinning the first substrate 10 (S406), and formation of the second grooves 73 (S407), and cleaning and etching (S408).

Since the preparation of the first substrate 10 (S401), the formation of the protective film 20 (S402), the formation of the first grooves 71 (S403), and the side etching of the first grooves 71 (S404) are performed in the same manner as in the processes S301, S302, S303 and S304 shown in FIG. 9, redundant description thereof will be omitted.

Further, the side etching of the first grooves 71 (S404) is performed after the formation of the first grooves 71 (S403) and before the attachment of the protective film 20 and the second substrate 30 (S405). Distortions, scratches, and particles generated during the formation of the first grooves 71 can be removed.

Since the attachment of the protective film 20 and the second substrate 30 (S405) is performed in the same manner as in the process S204 shown in FIG. 6, redundant description thereof will be omitted. Further, since the stacked substrate 50 obtained in the process S405 is the same as the stacked substrate 50 shown in FIG. 7D except that the etching of the side surfaces 71a of the first grooves 71 are completed, illustration thereof will also be omitted.

Further, since the thinning of the first substrate 10 is performed in the same manner as in the process S205 shown in FIG. 6, description thereof will be omitted. Since the stacked substrate 50 obtained in the process S406 is the same as the stacked substrate 50 shown in FIG. 8A except that the etching of the side surfaces 71a of the first grooves 71 are completed, illustration thereof will also be omitted.

The formation of the second grooves 73 (S407) is performed after the thinning of the first substrate 10 (S406). Unlike the first example shown in FIG. 6, FIG. 7A to FIG. 7D, and FIG. 8A to FIG. 8C, the second grooves 73 are formed by a cutting processing with a blade 401 as shown in FIG. 12 instead of the etching. The blade 401 grinds the division lines of the second main surface 12 of the first substrate 10. The second grooves 73 are connected to the first grooves 71, and the first substrate 10 is divided into the plurality of chips 15. Since the first grooves 71 are formed in advance, the blade 401 does not cut the device 14, so that distortions of the device 14 and formation of scratches thereon can be suppressed.

The cleaning and etching (S408) is performed in the same manner as in the process S308 shown in FIG. 9. In the process S408, the second grooves 73 are cleaned, and side surfaces 73a of the second grooves 73 are etched. Since the second grooves 73 are cleaned, grinding debris generated during the thinning of the first substrate 10 and cutting debris generated during the formation of the second grooves 73 can be removed. In addition, since the side surfaces 73a of the second grooves 73 are etched, distortions and scratches formed during the formation of the second grooves 73 can be removed.

The cleaning of the second grooves 73 is performed in the same manner as the cleaning of the secondary grooves 75 (FIG. 10D). Further, the etching of the side surfaces 73a of the second grooves 73 is performed in the same manner as the etching of the side surfaces 75a of the secondary grooves 75. Since the second grooves 73 and the secondary grooves 75 are common in that both are formed by the cutting processing with the blade, the same post-processing is performed.

Now, referring to FIG. 13 and FIG. 14A to FIG. 14C, a fourth example of the processing performed before the process S101 of FIG. 1 will be discussed.

Figure 13:
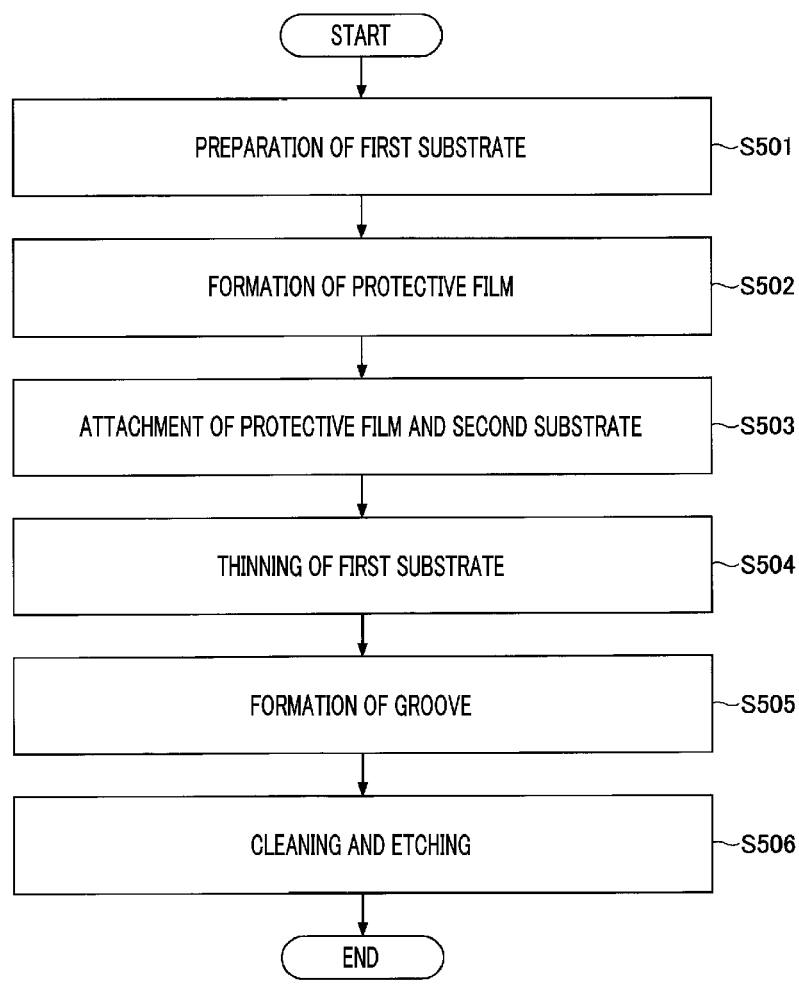
FIG. 13 is a flowchart illustrating a fourth example of the processing performed before the process S101 of FIG. 1.

As shown in FIG. 13, the substrate processing method includes preparation of the first substrate 10 (S501), formation of the protective film 20 (S502), attachment of the protective film 20 and the second substrate 30 (S501), thinning of the first substrate 10 (S504), formation of grooves 76 (S505), and cleaning and etching (S506).

Since the preparation of the first substrate 10 (S501) and the formation of the protective film 20 (S502) are performed in the same manner as in the processes S201 and S202 shown in FIG. 6, redundant description thereof will be omitted.

Figure 14A:
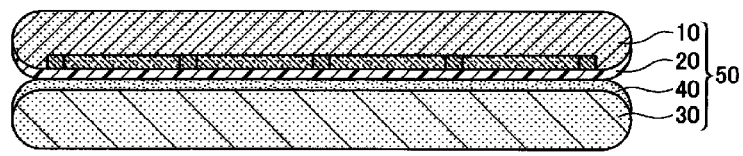
FIG. 14A, FIG. 14B, and FIG. 14C are diagrams illustrating a process S503, a process S504, and a process S505 of FIG. 13, respectively.

The attachment of the protective film 20 and the second substrate 30 (S503) is performed in the same manner as in the process S204 shown in FIG. 6 except that it is performed in the state that the first substrate 10 is not provided with grooves. The stacked substrate 50 obtained in the process S503 is shown in FIG. 14A.

Figure 14B:
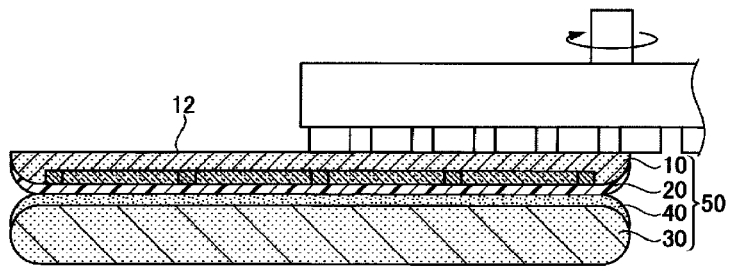
Figure 14C:
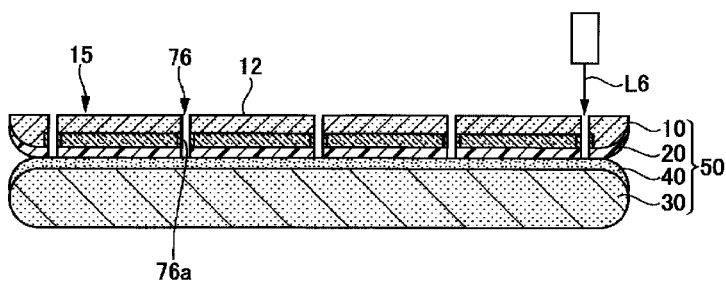

The thinning of the first substrate 10 (S504) is performed in the same manner as in the process S205 shown in FIG. 6 except that it is performed in the state that the first substrate 10 is not provided with grooves. The stacked substrate 50 obtained in the process S504 is shown in FIG. 14B.

The formation of the grooves 76 (S505) is performed after the thinning of the first substrate 10 (S504). The grooves 76 are formed on the division lines of the second main surface 12 of the first substrate 10 to penetrate the first substrate 10 and the protective film 20 and reach the adhesive film 40. By forming the grooves 76, the first substrate 10 is divided into the plurality of chips 15, and the protective film 20 is also divided for each of the chips 15.

Although the grooves 76 may be formed by a cutting processing with a blade, they are formed by an ablation processing with a laser beam L6 in the present exemplary embodiment. The ablation processing is effective when the device 14 is soft, for example, when the device 14 contains a porous Low-k material or the like.

Since the groove 76 penetrates the first substrate 10 and the protective film 20, the depth of the groove 76 is larger than the depth of the first groove 71 shown in FIG. 7C, and the intensity of the laser beam L6 is higher than the intensity of the laser beam L4 shown in FIG. 7C. Accordingly, distortions and scratches may easily occur. As a resolution, the cleaning and etching (S506) is performed after the formation of the grooves 76 (S505).

The cleaning and etching (S506) is performed in the same manner as in the process S308 shown in FIG. 9. In the process S506, the grooves 76 are cleaned, and side surfaces 76a of the grooves 76 are etched. Since the grooves 76 are cleaned, grinding debris generated during the thinning of the first substrate 10, debris generated during the formation of the grooves 76, and the like can be removed. In addition, since the side surfaces 76a of the grooves 76 are etched, distortions and scratches generated during the formation of the grooves 76 can be removed.

Furthermore, depending on the structure of the device 14, the grooves 76 may be formed by cutting. In this case as well, the cleaning and etching (S506) may be performed after the formation of the grooves 76 (S505). In this case, the same effects as described above can be obtained.

So far, the exemplary embodiment of the substrate processing apparatus and the substrate processing method according to the present disclosure have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

In the process S205 of FIG. 6, the process S307 of FIG. 9, the process S406 of FIG. 11, and the process S504 of FIG. 13, the first substrate 10 is thinned by grinding the second main surface 12 of the first substrate 10. However, the present disclosure is not limited thereto. In the thinning of the first substrate 10, a part of the first substrate 10 may be removed from the second main surface 12 side so that the second main surface 12 is brought close to the first main surface 11. For example, by radiating a laser beam to be concentrated to a division surface which divides the first substrate 10 in a plate thickness direction, a plurality of modification layers may be formed on the division surface at a regular distance therebetween, and a part of the first substrate 10 may be removed by cutting the first substrate 10 along the division surface starting from the modification layers.

The present application claims priority to Japanese Patent Application No. 2019-143300, field on Aug. 2, 2019, which application is hereby incorporated by reference in their entirety.

According to the exemplary embodiments, it is possible to suppress deterioration of a device of a chip when a light beam causing reduction of adhesive strength is radiated before picking up the chip.

I claim:

1. A substrate processing method, comprising:
    preparing a stacked substrate including a first substrate divided into multiple chips, a protective film divided for each of the multiple chips to protect a chip, a second substrate supporting the first substrate, and an adhesive film configured to attach the protective film and the second substrate;
    reducing adhesive strength of the adhesive film with a light beam configured to penetrate the second substrate;
    picking-up, from the adhesive film by a pick-up device, the chip and the protective film with the reduced adhesive strength to the adhesive film;
    removing the protective film by immersing the protective film in a liquid configured to dissolve the protective film, while the pick-up device is holding the chip from above, allowing the protective film to face downwards;
    activating a surface of the chip from which the protective film has been removed, while the pick-up device is holding the chip from above, allowing the surface from which the protective film has been removed to face downwards; and
    bonding the activated surface of the chip to a main surface of a third substrate on which a device is formed, while the pick-up device is holding the chip from above, allowing the surface from which the protective film has been removed to face downwards.

2. The substrate processing method of claim 1, further comprising:
    forming the protective film on a first main surface of the first substrate;
    attaching the protective film and the second substrate by the adhesive film after the forming of the protective film; and
    thinning the first substrate by removing a part of the first substrate such that a second main surface of the first substrate opposite to the first main surface is brought close to the first main surface after the attaching of the protective film and the second substrate.

3. The substrate processing method of claim 2, further comprising:
    forming a first groove on a division line of the protective film after the forming of the protective film and before the attaching of the protective film and the second substrate, the first groove being deeper than a device of the chip; and
    dividing the first substrate into the multiple chips by forming a mask provided with an opening formed on a division line of the second main surface of the first substrate after the thinning of the first substrate and before the picking-up of the chip, and by etching the second main surface through the opening of the mask to form a second groove connected to the first groove.

4. The substrate processing method of claim 2, further comprising:
    forming a groove on a division line of a surface of the protective film after the forming of the protective film and before the attaching of the protective film and the second substrate, the groove having a depth allowing the groove to reach the second main surface of the first substrate after being thinned;
    dividing the first substrate into the multiple chips by exposing the groove on the second main surface of the first substrate through the thinning of the first substrate after the attaching of the protective film and the second substrate; and
    cleaning the groove and etching a side surface of the groove after the thinning of the first substrate and before the picking-up of the chip.

5. The substrate processing method of claim 4,
    wherein the forming of the groove on the division line of the surface of the protective film comprises:
    forming a primary groove deeper than a device of the chip with a laser beam and etching a side surface of the primary groove; and
    forming a secondary groove having a depth allowing the secondary groove to reach the second main surface of the first substrate after being thinned, by cutting a bottom surface of the primary groove.

6. The substrate processing method of claim 2, further comprising:
    forming a first groove on a division line of a surface of the protective film after the forming of the protective film and before the attaching of the protective film and the second substrate, the first groove being deeper than a device of the chip;
    dividing the first substrate into the multiple chips by forming a second groove connected to the first groove by cutting a division line of the second main surface of the first substrate after the thinning of the first substrate and before the picking-up of the chips; and
    cleaning the first groove and the second groove and etching side surfaces of the first groove and the second groove after the thinning of the first substrate and before the picking-up of the chips.

7. The substrate processing method of claim 6, further comprising:
    etching the side surface of the first groove after the forming of the first groove and before the attaching of the protective film and the second substrate.

8. The substrate processing method of claim 2, further comprising:
    dividing the first substrate into the multiple chips and dividing the protective film for each of the multiple chips by forming, on a division line of the second main surface of the first substrate, a groove having a depth enough to reach the adhesive film, after the thinning of the first substrate and before the picking-up of the chips; and
    cleaning the groove and etching a side surface of the groove after the forming of the groove and before the picking-up of the chip.

9. The substrate processing method of claim 8,
    wherein the groove having the depth enough to reach the adhesive film from the second main surface of the first substrate is formed by a laser beam.

* * * * *